United States Patent [19]

Schaeffer et al.

[11] Patent Number: 4,975,656

[45] Date of Patent: Dec. 4, 1990

[54] ENHANCED SECONDARY ELECTRON EMITTER

[75] Inventors: Gregory T. Schaeffer, Williamsport; John C. Cipolla, Trout Run; Guilford R. MacPhail, Williamsport, all of Pa.

[73] Assignee: Litton Systems, Inc., Woodland Hills, Calif.

[21] Appl. No.: 332,628

[22] Filed: Mar. 31, 1989

[51] Int. Cl.[5] .......................... H03F 3/54; H01J 1/32; H01J 9/04

[52] U.S. Cl. ...................................... 330/42; 313/311; 313/346 R; 330/47; 445/50; 445/51

[58] Field of Search .................... 330/42, 47; 313/311, 313/340 R; 331/89; 445/49-51; 315/39.63

[56] References Cited

U.S. PATENT DOCUMENTS

| | | | |
|---|---|---|---|
| 3,255,422 | 6/1966 | Feinstein et al. | 330/43 |
| 3,619,709 | 11/1971 | Dudley et al. | 315/39.3 |
| 3,998,678 | 12/1976 | Fukase et al. | 313/336 X |
| 4,260,665 | 4/1981 | Aida et al. | 313/346 R X |
| 4,700,109 | 10/1987 | MacPhail | 315/39.3 |

FOREIGN PATENT DOCUMENTS

| | | |
|---|---|---|
| 404169 | 10/1979 | United Kingdom . |
| 503211 | 3/1985 | United Kingdom . |
| 504927 | 4/1986 | United Kingdom . |
| 671210 | 9/1987 | United Kingdom . |
| 751735 | 3/1989 | United Kingdom . |
| 942685 | 4/1989 | United Kingdom . |
| 1141495 | 4/1989 | United Kingdom . |
| 2172426A | 5/1989 | United Kingdom . |

OTHER PUBLICATIONS

Jepsen, R. L., and Muller, M. W., entitled "Enhanced Emission From Magnetron Cathodes", *Journal of Applied Physics,* Sep., 1951, vol. 22, No. 9, pp. 1196-1207.

*Primary Examiner*—James B. Mullins
*Attorney, Agent, or Firm*—Poms, Smith, Lande & Rose

[57] ABSTRACT

The present invention discloses an enhanced secondary electron emitter cathode suitable for use in a typical crossed-field amplifiers. The emitter surfaces of the cathode are formed into protuberances or knurls. The cathode's secondary emission characteristics are enhanced by providing protuberances with more surface area for electrons to bombard and for electrons to be emitted from. The protuberances increase the variety of angles of incidence of bombarding electrons thereby increasing the probability that bombarded electrons can escape the cathode's surfaces.

9 Claims, 1 Drawing Sheet

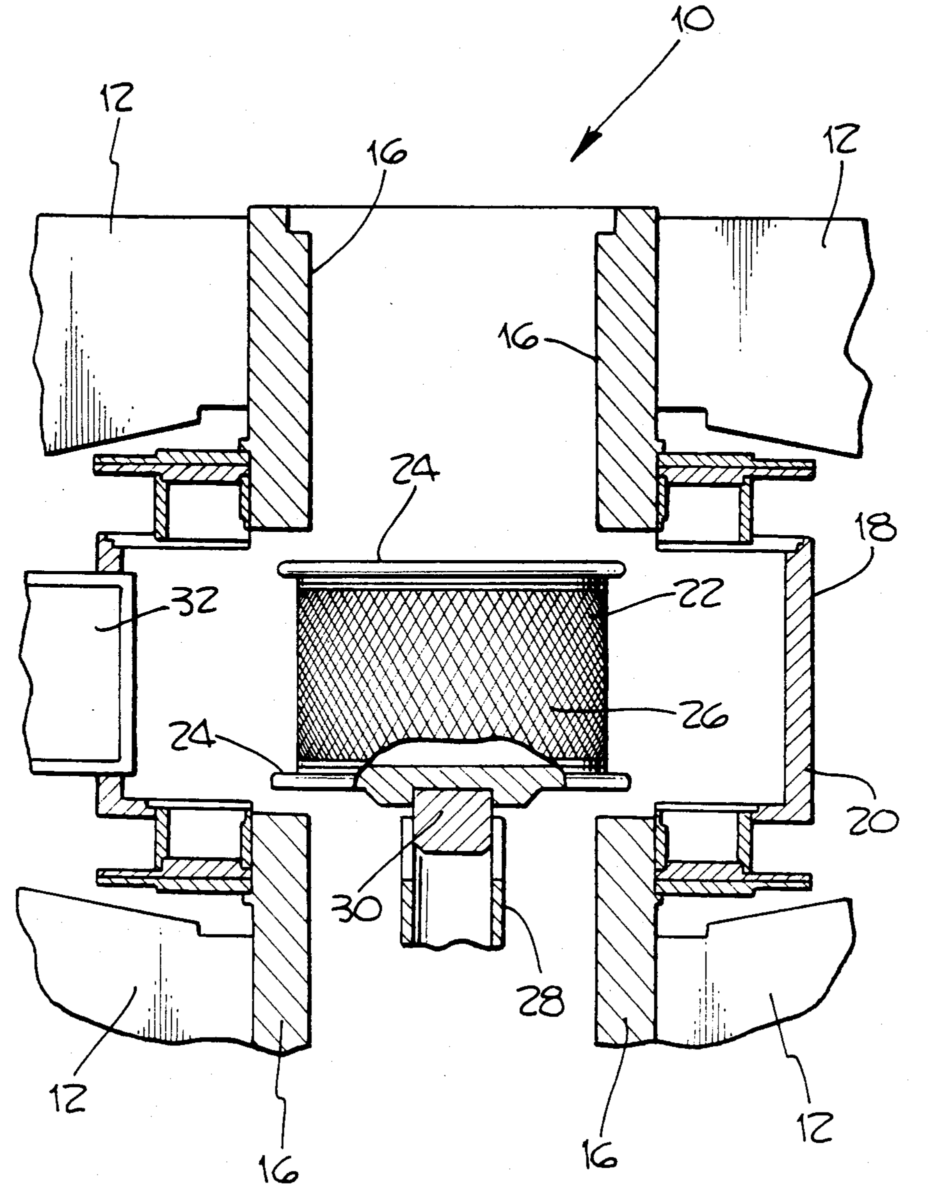
10
12
16
12
16
24
18
32
22
26
24
20
30
28
12
16
16
12

ENHANCED SECONDARY ELECTRON EMITTER

The present invention relates generally to cathodes having enhanced secondary electron emission characteristics and, more particularly, to crossed-field amplifiers incorporating such improved cathodes.

BACKGROUND OF THE INVENTION

The present invention was developed in response to a need for increasing the life capability in crossed-field amplifiers used within existing radar systems without sacrificing any of the performance capabilities of the crossed-field amplifiers.

Crossed-field amplifiers have been known for several years. These amplifiers are typically used in electronic systems which require high voltages, such as radar systems. Typically, the cathode in such amplifier is a thermionic-type emitter which operates on the principle of direct heating to boil off electrons. A problem with such thermionic cathodes used in crossed-field amplifiers is their relatively short life capability, generally on the order of about 1000 hours of operation. Failure of the crossed-field amplifier due to the short life span of its thermionic cathode causes the radar system incorporating the crossed-field amplifier to be inoperable.

It is known that improved life capability of crossed-field amplifiers may be achieved by using a non-thermionic emitter cathode. Typically, pure metal, secondary-emitter type cathodes, such as ones made of molybdenum, platinum, or nickel may be used. Such secondary emission type cathodes operate on the principle of bombarding the metal with electrons to drive off additional electrons which then spin toward an anode.

However, existing secondary emission type cathodes fall short of meeting the performance requirements of existing radar systems, particularly in the area of current mode boundaries.

SUMMARY OF THE INVENTION

Accordingly, an object of the present invention is to provide a crossed-field amplifier with an improved life capability.

A further object of the present invention is to provide an improved life capability crossed-field amplifier capable of meeting or exceeding the performance requirements of existing radar systems into which the amplifier will be incorporated.

In accomplishing these and other objects, there is provided a platinum secondary emission type cathode having improved secondary emission characteristics. Such improved characteristics are achieved by forming protuberances on the platinum surface of the cathode. The improved secondary emission characteristics enhance the performance capabilities of the cathode and its associated crossed-field amplifier so as to meet or exceed the performance requirements of the radar systems into which they will be incorporated.

The inventive concept described herein was disclosed to technical personnel at the Department of the Navy who expressed doubt that the concept would work. Consequently, two prototype units of crossed-field amplifier tubes incorporating enhanced platinum secondary emission cathodes were loaned to the Navy for experimental testing. This testing demonstrated that knurling of the platinum surface of the cathode enhanced the cathode's secondary emission characteristics sufficiently to meet or exceed the performance requirements of the radar systems in which they were installed, while simultaneously providing a much greater life capability for their associated crossed-field amplifiers.

BRIEF DESCRIPTION OF THE DRAWING

The single FIGURE shows a cross-sectional view of the interaction chamber of a typical crossed-field amplifier with the cathode knurling of the present invention shown in partial side elevation.

DESCRIPTION OF THE PREFERRED EMBODIMENT

Referring now to the drawing, a cross-sectional view of an interaction area of a typical crossed-field amplifier 10 is shown, including the ends of a pair of U-shaped permanent magnets 12. The outer portions of the U-shaped magnets, as well as the crossed-field amplifier's support legs, outer housing, and coolant system are not shown. Extending between the legs of each U-shaped magnet are pole pieces 16 which pass into the upper and lower surfaces of an anode/cathode housing 18. The anode 20 is seen as the outer surface of housing 18. Two wave guide assemblies 32, only one of which is shown, extend from the anode/cathode housing 18 for coupling output power to an external load. Cup-shaped cathode 22, shown in partial side elevation, is provided with upper and lower shielding rings 24 to inhibit leakage of electrons as they spin from the surface of cathode 22 toward anode 20. A high voltage connection tube 28 connects to voltage post 30 which in turn connects to a the lower surface of cathode 22. In the preferred embodiment, cathode 22 may be maintained at 55,000 volts by a potential applied though the connecting tube 28 to the voltage post 30.

It will be understood that in a typical crossed-field amplifier 10, electrons from a thermionic emitter cathode are boiled off the cathode and travel across the magnetic field established by pole pieces 16 toward anode 20 where they enter wave guide assembly 32 for use on an external load.

The present invention replaces the old thermionic type emitter cathode with a pure platinum secondary emission cathode whose emitter surfaces are formed into protuberances or knurls 26 by a knurling process. The dictionary defines a knurl as "one of a series of small ridges or beads used on a usually metal surface." Webster's Third New International Dictionary, page 1253. Thus, it is seen in the drawing that knurling of the emitter surfaces results in a series of ridges which are formed by non-parallel grooves criss-crossing to create bead-like emitter protuberances or electrodlets. In the preferred embodiment, as can be seen in the drawing, these emitter protuberances or electrodlets are symmetrical and are uniformly distributed across the surface of emission cathode 22. Knurling operates in two ways to improve the secondary emission characteristics of secondary emitters.

First, it increases the effective surface area of the cathode thereby providing more area to be bombarded by electrons as well as more area from which excited electrons in the metal may escape. Second, the peaks and slopes of the knurl increase the variety of angles of incidence which bombarding electrons may make with the cathode's surface. Note that the angle of incidence is defined as that angle existing between the path of a bombarding electron and the normal to that electron's area of impact on the cathode's surface. Hence, on a certain percentage of the cathode's surface, bombarding electrons will have larger angles of incidence with the cathode's surface than if knurling was absent. Such bombarding electrons will penetrate the cathode's surface less deeply than electrons with smaller angles of incidence. Consequently, the bombarded electrons in the cathode will themselves be closer to the cathode's surface thereby increasing the probability they will escape the surface and become part of the cathode's secondary emission. Hence, the overall secondary emission of the cathode is enhanced and, in the preferred embodiment, the performance requirements of the radar systems in which the cathode and its associated cross-field amplifier are incorporated, will be met.

In conclusion, it is to be understood that the foregoing description and accompanying drawing relate to only one referred embodiment of the present invention. Other embodiments may be utilized without departing from the spirit and scope of the invention. Thus, by way of example and not of limitation, the secondary emission surfaces of cathode 22 may have a plurality of protuberances formed thereon by a method other than knurling. Also, the shape of cathode 22, may be varied to suit the particular crossed-field amplifier or other application in which enhanced secondary emission is desirable. Accordingly, it is to be further understood that the description and drawing set forth hereinabove are for illustrative purposes only and do not constitute a limitation on the scope of the invention.

We claim:

1. A method of enhancing the secondary emission characteristics of a cathode, comprising the steps of:

forming the electron emitting surfaces of said cathode out of platinum; and forming a plurality of uniformly distributed knurl-like protuberances on said platinum surfaces.

2. In a cathode having electron emitting surfaces, the improvement comprising:

a plurality of symmetrical protuberances formed on said electron emitting surfaces for enhancing the secondary emission characteristics of said cathode.

3. In a cathode, as claimed in claim 2, wherein said protuberances are knurl-like.

4. In a cathode, as claimed in claim 3, additionally comprising:

said plurality of knurl-like protuberances being uniformly distributed across said electron emitting surfaces.

5. In a crossed-field amplifier having an anode and a cathode establishing an electric field across a magnetic field, the improvement comprising:

said cathode having platinum surfaces; and a plurality of symmetrical protuberances formed on said platinum surfaces for enhancing the secondary emission characteristics of said platinum-surfaced cathode.

6. In a crossed-field amplifier, as claimed in claim 5, wherein said protuberances are knurl-like.

7. In a crossed-field amplifier, as claimed in claim 6, additionally comprising:

said plurality of knurl-like protuberances being uniformly distributed across said platinum surfaces.

8. A crossed-field amplifier comprising:

a pair of magnetic pole pieces which create a magnetic field in an interaction area;

an anode and cathode which establish an electric field across said magnetic field in said interaction area and wherein said cathode includes platinum electron emitting surfaces;

a high voltage power supply connected to said cathode; and a plurality of symmetrical, knurl-like protuberances formed on said platinum surfaces for enhancing the secondary emission characteristics of said cathode.

9. A crossed-field amplifier, as claimed in claim 8, wherein said plurality of knurl-like protuberances are uniformly distributed across said platinum surfaces.

* * * * *